(12) United States Patent
Robinson et al.

(10) Patent No.: US 6,379,225 B1
(45) Date of Patent: *Apr. 30, 2002

(54) PLANARIZATION PROCESS WITH ABRASIVE POLISHING SLURRY THAT IS SELECTIVE TO A PLANARIZED SURFACE

(75) Inventors: Karl M. Robinson; Guy Hudson; Scott Meikle, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/569,921

(22) Filed: May 11, 2000

Related U.S. Application Data

(63) Continuation of application No. 08/869,256, filed on Jun. 5, 1997, now Pat. No. 6,062,952.

(51) Int. Cl.$^7$ .................................................. B24B 1/00
(52) U.S. Cl. .............................. 451/41; 451/28; 451/57

(56) References Cited

U.S. PATENT DOCUMENTS

| | | |
|---|---|---|
| 4,549,374 A | 10/1985 | Basi et al. |
| 4,959,113 A | 9/1990 | Roberts |
| 5,069,002 A | 12/1991 | Sandhu et al. |
| 5,637,028 A | 6/1997 | Haisma et al. |
| 5,676,587 A | 10/1997 | Landers et al. |
| 5,709,588 A | 1/1998 | Muroyama |
| 6,062,952 A | * 5/2000 | Robinson et al. ............ 451/41 |

FOREIGN PATENT DOCUMENTS

JP  7-221054  8/1995

\* cited by examiner

*Primary Examiner*—George Nguyen
(74) *Attorney, Agent, or Firm*—Workman, Nydegger & Seeley

(57) ABSTRACT

Parameters of an improved planarization process for a semiconductor structure surface are optimized to cause a height reduction rate of the surface that adjusts downward by a factor of at least three once the surface becomes substantially planarized. Localized over-polishing is substantially eliminated by the acquired selectivity of the planarization process to planarized surfaces. One embodiment of the improved planarization process comprises the use of a polishing slurry including a plurality of abrasive particles of a size selected that the polishing of a surface having a height causes a surface height reduction rate that drops once the surface becomes planarized. Preferred abrasive particle sizes are about 50 nm in mean diameter or less.

41 Claims, 5 Drawing Sheets

US 6,379,225 B1

PLANARIZATION PROCESS WITH ABRASIVE POLISHING SLURRY THAT IS SELECTIVE TO A PLANARIZED SURFACE

RELATED APPLICATIONS

This is a continuation of U.S. patent application Ser. No. 08/869,256, filed on Jun. 5, 1997, titled "Planarization Process with Abrasive Polishing Slurry That Is Selective to a Planarized Surface", now U.S. Pat. No. 6,062,952.

BACKGROUND OF THE INVENTION

1. The Field of the Invention

The present invention relates generally to processes for planarizing a semiconductor substrate surface. More particularly, the present invention relates to processes for abrasively polishing a semiconductor substrate surface with processing parameters selected to cause the rate of reduction of the semiconductor substrate surface height to adjust downward once the semiconductor substrate surface becomes planarized. The present invention is particularly useful for maximizing planarization efficiency during the planarization of an interlevel dielectric layer on a semiconductor structure during integrated circuit fabrication.

2. The Relevant Technology

Modern integrated circuits are manufactured by an elaborate process in which electronic circuits composed of semiconductor devices are integrally formed on a small semiconductor structure. The conventional semiconductor devices which are formed on the semiconductor structure include capacitors, resistors, transistors, diodes, and the like. In advanced manufacturing of integrated circuits, hundreds of thousands of these semiconductor devices are formed on a single semiconductor structure.

Integrated circuits may be arranged as adjoining dies on a common silicon substrate of the semiconductor structure. Between the dies are located surface level scribe regions where the dies will be cut apart to form discrete integrated circuits. Within the dies, the surface of the semiconductor structure is characterized by raised regions that are caused by the formation of the semiconductor devices. FIG. 1 shows an example of these raised regions, where several such raised regions in the form of arrays 14 are depicted separated by lower regions of lesser height in the form of slots 16 on a silicon substrate 12 of a semiconductor structure 10.

It is conventional in the fabrication of integrated circuits to create the semiconductor devices of semiconductor structure 10 by alternately depositing and patterning layers of conducting and insulating material on the surface of semiconductor structure 10. Frequently, in preparation for the deposition of successive layers, the surface of semiconductor structure 10 is required to be rendered smooth and flat. Thus, in order to prepare the surface of semiconductor structure 10 for a material deposition operation, a planarization process is required to be conducted on the surface of semiconductor structure 10. Planarization is typically implemented by growing or depositing an interlevel dielectric layer 18 of insulating material such as oxide or nitride on semiconductor structure 10, typically to fill in rough or discontinuous areas such as slots 16. Interlevel dielectric layer 18 is deposited as a conformal film, causing it to have a non-planar surface characterized by raised vertically protruding features 20a of a greater height extending upward above arrays 14 and by open troughs 20b of a lower height located above slots 16. The planarization process is used to reduce the height of vertically protruding features 20a down to a target height that is typically a small distance above the level of the tops of arrays 14 where, ideally, a planarized surface will be formed. The small distance may be quantified as a height range that is greater than the height S set forth in FIG. 1. The term "planarized surface," as used herein, refers to a surface which is flat, smooth, and of a continuous height. An example of a properly planarized interlevel dielectric layer is illustrated in FIG. 2, wherein interlevel dielectric layer 18 has been reduced to planarized oxide regions 22 filling in slots 16 between arrays 14.

One commonly used planarization process is abrasive polishing. Abrasive polishing generally involves pressing a wetted polishing surface against semiconductor structure 10 under controlled pressure and temperature and with a constant relative movement. Several forms of abrasive polishing are used, but one of the most common employs a polishing slurry comprised of tiny abrasive indenter particles. As defined herein, the term indenter particle refers to a particulate material added to a polishing solution to render the polishing solution abrasive to a surface being polished. The particulate additive is typically formed of discrete particles of inorganic material such as silica which have a greater hardness than the surface being polished and are therefore abrasive to the surface being polished. The indenter particles can also be formed of a composition of such materials. The constant movement of the abrasive polishing process is, in one form thereof, an abrasive polishing provided by a rotational polishing system. An example of such a system is found in an apparatus known as the Model 372 Polisher manufactured by IPEC Planar Systems of Phoenix, Ariz.

FIG. 3 shows a representative rotational polishing system 26 having a rotatable polishing platen 28, a wafer polishing head assembly 34, and a polishing slurry supply system 36. Polishing platen 28 is typically covered with an underpad 30 and a polishing pad 32 made of a replaceable, relatively soft material such as polyurethane. Together, polishing platen 28, underpad 30, and polishing pad 32 make up what is known as a "pad-stack."

Wafer polishing head assembly 34 holds semiconductor structure 10 adjacent to polishing pad 32. Wafer polishing head assembly 34 includes a motor (not shown) for rotating the polishing head and semiconductor structure 10. Wafer polishing head assembly 34 further includes a polishing head displacement mechanism (not shown) which moves semiconductor structure 10 back and forth across polishing pad 32, and which is also rotated by a motor. Wafer polishing head assembly 34 applies a controlled downward pressure to semiconductor structure 10 to hold semiconductor structure 10 against polishing pad 32.

A polishing slurry 38 is introduced onto polishing pad 32 by polishing slurry supply system 36 and typically contains abrasive indenter particles therein to assist in the mechanical stripping of interlevel dielectric layer 18. Polishing slurry 38 may also contain a chemical additive that chemically modifies the material of interlevel dielectric layer 18 to allow for more rapid polishing rates. This form of abrasive polishing is known as chemical-mechanical polishing (CMP). Abrasive polishing without the use of a slurry is also used for planarization purposes.

In the rotational polishing system depicted in FIG. 3, the surface of semiconductor structure 10 is bathed in polishing slurry 38 that floats within pores or preformed depressions in polishing pad 32 against which semiconductor structure 10 is pressed, such that the indenter particles are pressed against the surface of semiconductor structure 10 under a downward pressure from polishing pad 32. The lateral motion of polishing pad 32 causes the indenter particles to have a trajectory propelling them across the surface of semiconductor structure 10, resulting in volumetric removal of the material of vertically protruding features 20a of semiconductor structure 10. In chemical-mechanical polishing, the polishing mechanism is a combination of mechanical action and chemical reaction with the material being polished with polishing slurry 38.

A related polishing system for providing constant movement is orbital polishing. Orbital polishing is similar to rotational polishing, but in orbital polishing, wafer polishing head assembly 34 is moved by a polishing head displacement mechanism in an oval pattern over polishing pad 32.

Linear track polishing is a further form of abrasive polishing. One difference between linear track polishing and rotational polishing is that the linear track polishing surface comprises a platen in the form of a continuous drive belt that is similarly porous and on which floats the polishing slurry. The term "polishing surface" as used herein is intended to include linear track polishing platens, as well as orbital polishing system surfaces, and rotating polishing system surfaces such as polishing pad 32.

In the semiconductor industry, abrasive polishing is used for a variety of surface planarization processes in addition to interlevel dielectric layer planarization. There are various types of planarizable surfaces typically located on semiconductor structure 10, including conductive and insulating materials such as oxides, nitrides, polysilicon, single crystalline silicon, amorphous silicon, and mixtures thereof, many of which, in current process flows, must be planarized.

As circuit densities increase, abrasive polishing has become one of the most viable techniques for planarization, particularly for interlevel dielectric layers. Abrasive polishing with a slurry is particularly favored for its high rate of planarization. Because of its significant viability, improvements in abrasive slurry types of planarization processes are increasingly being sought.

FIG. 4 illustrates one drawback of current abrasive slurry planarization processes. This drawback involves an adverse effect hereafter referred to as "local over-polishing" that results when raised regions such as arrays 14 separated by regions of a lesser height such as slots 16 are planarized with abrasive polishing in a slurry. FIG. 4 illustrates an intermediate stage in the planarization process with a dotted line showing the location of an intermediate non-planar surface 40 which occurs at an arbitrary time in a conventional abrasive polishing process. The drawback is shown therein as the occurrence of abraded depressions 40a caused by the indenter particles of polishing slurry 38.

The indenter particles in polishing slurry 38 typically have a trajectory that propels the indenter particles toward the bottoms of troughs 20b. The impact of the indenter particles in the bottoms of troughs 20b causes local over-polishing in the form of depressions 40a to occur. Troughs 20b thus continue to exist even after the surface of interlevel dielectric layer 18 has been polished below the original depth of troughs 20b. Local overpolishing 40a is eventually minimized, but not without removing a substantial amount of otherwise planar material underneath vertically protruding features 20a.

To compensate for the foregoing problem, prior art processes "over-deposit" interlevel dielectric layer 18 in order to fully planarize interlevel dielectric layer 18. That is, the prior art processes deposit interlevel dielectric layer 18 with a greater depth than would otherwise be required if local over-polishing did not occur.

As an illustration, in typical prior art process flows, interlevel dielectric layer 18 is deposited with a depth, shown in FIG. 1 as dimension "D," that is more than twice the step height, shown as dimension "S" of vertically protruding features 20a. If it were not for local over-polishing, interlevel dielectric layer 18 could be deposited with a thickness above the tops of arrays 14 corresponding approximately to the target thickness plus that of the step height, denoted by the dimension S, plus any required "post-polishing" thickness. Depositing the greater depth of material consumes process time and resources, increasing the cost of the integrated circuit fabrication process. It also takes longer to planarize the layer of greater depth, further increasing fabrication costs by reducing throughput of the integrated circuit fabrication process. Thermal budget is also increased, as it takes longer to harden the greater thickness of interlevel dielectric layer 18 with an anneal process that is generally conducted in conventional process flows.

A deposition of the material being planarized with additional depth is also generally needed to provide a window of time for stopping the planarization process after the polished surface has become planarized such that the height thereof is not overly reduced.

In view of these and other problems of prior art planarization processes, there is a need in the art for an improved process of planarizing structural layers of a surface with an abrasive slurry which avoids the occurrence of localized over-polishing and reduces the need for over-depositing the layers being planarized.

SUMMARY OF THE INVENTION

The present invention overcomes the above-discussed problems encountered in the prior art by providing a process of planarizing a non-planar surface of a semiconductor structure with abrasive polishing using a porous polishing surface and an improved polishing slurry.

In the microelectronics industry, a substrate refers to one or more semiconductor layers or semiconductor structures which includes active or operable portions of semiconductor devices. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above.

Under the inventive process, the parameters of the planarization process are selected to cause the maximum height of the surface of the semiconductor substrate to be reduced at a rate that is reduced by a factor of at least three once the semiconductor substrate surface has become planarized. A difference in relative height reduction rate between a non-planar surface and a planar surface, hereafter referred to as "selectivity to planar surfaces," can be up to a factor of twelve or more under the present invention.

Under the inventive process, the semiconductor substrate is abrasively polished in the polishing slurry with a polishing surface to effect planarization of the semiconductor substrate surface. The polishing surface can be provided on any conventional abrasive polishing system, such as, for example, a rotary polisher pad, a belt polisher pad, or an orbital polisher pad. The polishing surface is preferably selected to be relatively rigid and inflexible, such that it does not substantially conform to the non-planar surfaces during the abrasive polishing operation. The slurry may be a chemically active slurry as is commonly used in chemical-mechanical polishing (CMP) or may be simply an inert mechanical polishing slurry. The slurry is preferably selected for a preferred viscosity and drag coefficient.

One parameter that has been found to contribute to a selectivity to planar surfaces is the size of the indenter particles used in the polishing slurry. The indenter particles are preferably selected to be of a mean diameter that causes the planarization process to remove material from a non-planar surface at a substantially faster rate than it removes material from a planar surface. This difference in material removal rates associated with the selectivity to planar surfaces results in the difference in height reduction rates between non-planar surfaces and planar surfaces.

The indenter particles are preferably selected to have a mean diameter of about 50 nm or less, and more preferably, to have a mean diameter in a range from about 8 to about 25 nm Most preferably, the mean diameter of the indenter particles is selected to be about 12 nm. The height reduction rate of the process when using appropriately sized particles is reduced by at least three times once the surface has become planarized. When indenter particles of about 12 nm in mean diameter are used, the height reduction rate can be reduced by a factor of 12 or more.

Other parameters of the planarization process, such as polishing speed, slurry viscosity, and polishing pressure, can also be varied to maximize the selectivity to planar surfaces. For instance, under the present invention, the polishing pressure can be reduced, such that overall material removal rates is sacrificed, but selectivity to planar surfaces is achieved.

The currently preferred manner of optimizing the process parameters to achieve a high selectivity is to first optimize rotation speed, slurry viscosity, polishing pressure, and other parameters for an optimum overall material removal rate and then to vary the indenter particle size to achieve the desired selectivity to blanket surfaces.

For instance, an abrasive particle size is preferably selected that causes the indenter particles to have a trajectory in a direction which for the majority of the planarization process causes the indenter particles to primarily contact the top of raised exposed surfaces while not substantially contacting lower surfaces. Generally, the aforesaid trajectory is achieved by holding polishing speed and polishing pressure constant while reducing the size of the indenter particles to within the aforementioned preferred ranges such that the indenter particles have a reduced momentum and increased drag. So doing will slightly lower the overall material removal rate but has been found to cause the desired selectivity to planar surfaces.

Also, in order to cause a trajectory of the abrasive particles that primarily contacts the tops of upper surfaces rather than surfaces of lesser height located between the upper surfaces, a non-conformal polishing pad is preferably used.

As a result of the selectivity to planar surfaces provided by the present invention, localized over-polishing between upper surfaces is substantially eliminated. Accordingly, when forming and planarizing an interlevel dielectric layer under the inventive process, the interlevel dielectric layer need not be over-deposited with excess depth and can be formed with a depth wherein the bottoms of the lowest troughs in the interlevel dielectric layer are a desired target height above the highest vertically protruding features and do not need to be over-deposited. Consequently, cost and thermal budget are reduced and throughput is increased.

A polishing slurry is also provided that is optimized to achieve a high selectivity to planar surfaces of at least 3. The polishing slurry preferably includes indenter particles with a mean diameter selected to be in the ranges discussed above. Also provided is a polishing system for planarizing a semiconductor structure. The polishing system comprises a polishing surface as described above, and a polishing slurry using indenter particles of a size that is selected in the manner described above to cause a selectivity to planar surfaces.

Thus, a planarization process, polishing slurry, and a polishing system are provided that provide selectivity to planar surfaces. The selectivity to planar surfaces in return forms a broad window of time that allows the process to be easily terminated once the planar surface is achieved without removing a significant amount of material from the surface once the surface has become planarized. The selectivity to planar surfaces also helps avoid the occurrence of localized over-polishing. The need for over-depositing of the interlevel dielectric layer is consequently eliminated, thereby increasing throughput and reducing integrated circuit fabrication costs.

BRIEF DESCRIPTION OF THE DRAWINGS

A more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
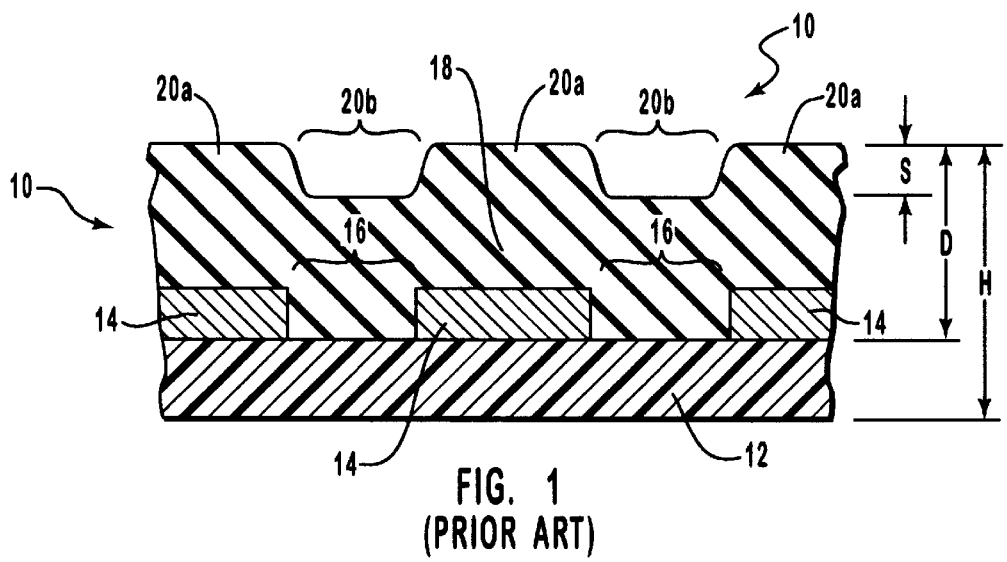
FIG. 1 shows a partial cross-sectional view of a semiconductor structure having a surface in need of planarization.
Figure 2:
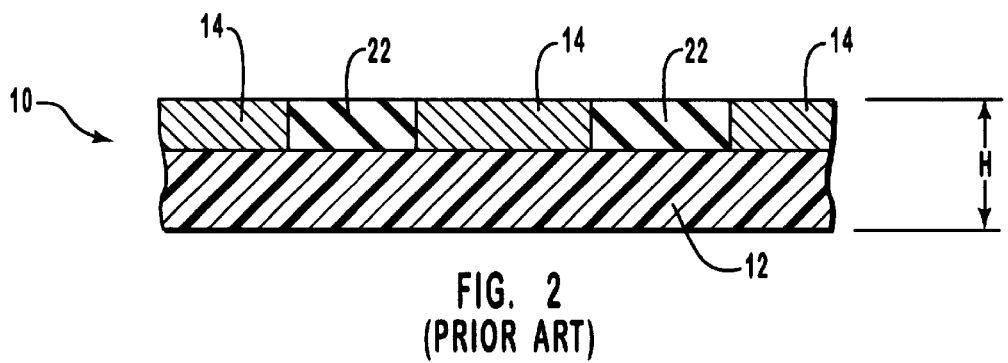
FIG. 2 shows a partial cross-sectional view of the semiconductor structure of FIG. 1, after planarization of the surface of the semiconductor structure.
Figure 3:
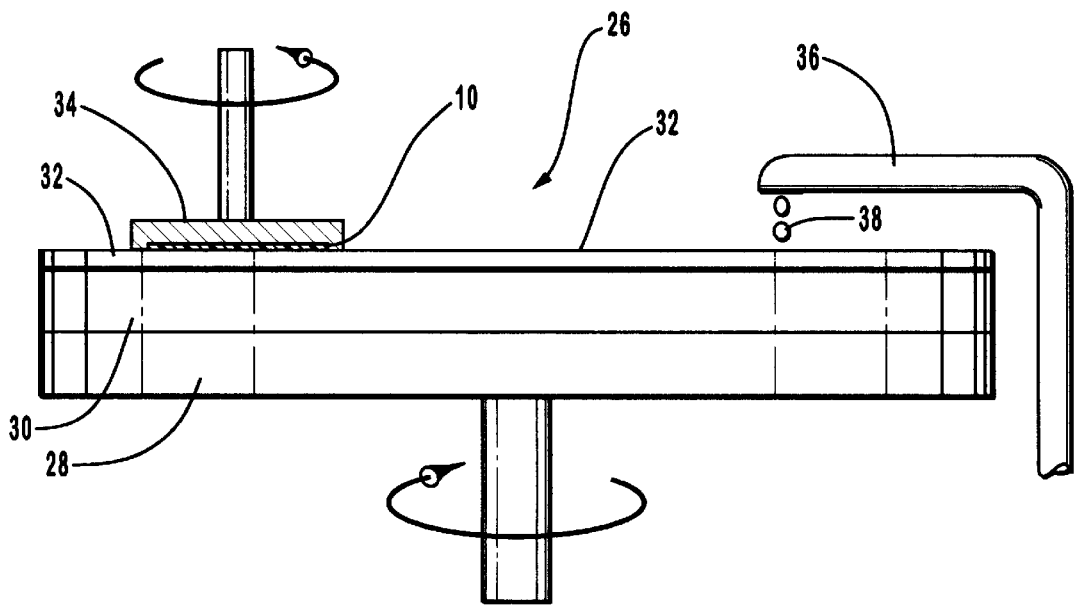
FIG. 3 shows a front elevational view of a rotational polishing system and a semiconductor structure engaged with the rotational polishing system.

Advantages of the present invention will become readily apparent to those skilled in the art to which the invention pertains from the following detailed description, wherein preferred embodiments of the invention are shown and described in the disclosure by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

New technologies to overcome the inefficiency and local over-polishing problems of conventional planarization processes have generally concentrated on improving the polishing pads, process parameters, polishing machines, or chemistry of the abrasive polishing process, and have failed to focus on obtaining a difference in material removal rates between non-planar and planar surfaces. The present invention, on the other hand, involves the discovery that the process parameters used in the planarization process can be selected to achieve a difference in the relative material removal rates between raised or prominent surfaces and surfaces of lesser height that helps to overcome the inefficiency and local over-polishing problems discussed above. This difference in material removal rates corresponds directly to a difference in height reduction rates.

In accordance with this discovery, the present invention comprises an abrasive polishing planarization process that is conducted with the use of a polishing slurry and a polishing surface to planarize a non-planar semiconductor substrate surface. The parameters of the planarization process are selected to result in a non-planar surface height reduction rate that adjusts downward by a factor of at least three once a planarized surface is achieved. By optimizing the difference in non-planar and planar surface height reduction rates through proper selection of the planarization parameters, the abrasive polishing planarization process is effectively caused to stop on a planar surface, thereby selectively terminating the planarization process. An advantage of the present invention is that the selectivity to planar surfaces provided by the proper selection of the process parameters substantially eliminates the occurrence of localized over-polishing and results in a high planarization efficiency. It also provides a broader window for terminating the planarization process once the surface being planarized has become substantially planar without a substantial reduction of the height of the planarized surface.

As an example of one of the parameters that are intended to be varied in order to achieve the desired selectivity, it is anticipated that lowering the polishing pressure below about 5 PSI will produce a lower material removal rate but a greater selectivity to planar surfaces. Altering the polishing speed, polishing surface, or type of polishing system from that which produces the optimum material removal rates can also have an effect on the selectivity to planar surfaces, and the manner of doing so will be readily understood by one of skill in the art.

One further planarization process parameter which can be varied under the present invention in order to achieve a selectivity to planar surfaces is the size of the indenter particles contained in the polishing slurry of an abrasive polishing system. As defined herein, indenter particles are abrasive particles such as silica that are included in an abrasive polishing slurry to physically impact and abrade away a surface that is being polished. It has been found that by optimizing the other process parameters for maximum material removal rates and varying the indenter particle size, a height reduction rate can be achieved that adjusts downward by a factor of at least three once the surface becomes planarized.

The plotted graphs of FIGS. 5 through 8 are included to illustrate the manner in which the size of the indenter particles can be varied to achieve a selectivity to planar surfaces. A rotational polishing system was used to polish a semiconductor structure of in-process DRAM memory dies in collecting the data of the graphs of FIGS. 5 through 8. The parameters of the abrasive polishing process were first optimized for high material removal rate, and then the indenter particle sizes were varied to achieve a high selectivity to planarized surfaces. The parameters used in collecting the data of FIGS. 5 through 8 include the use of a polishing system comprising an IPEC 472 rotational polishing machine with an eight inch polishing tool. For the polishing surface, a standard urethane perforated polishing pad with a low conformality was used, and comprised a Rodel IC-1000 perforated pad with an FR4 underpad. The polishing speed was set with a platen RPM of 30 and a carrier RPM of 10. The temperature was 90 degrees Fahrenheit, and the polishing pressure was set at about 5 PSI. The slurry was varied between a Klebosol 30N50, 30N25, and 30N12 slurry, and a Rodel ILD 1300 slurry with a 120 nm particle size.

Figure 5:
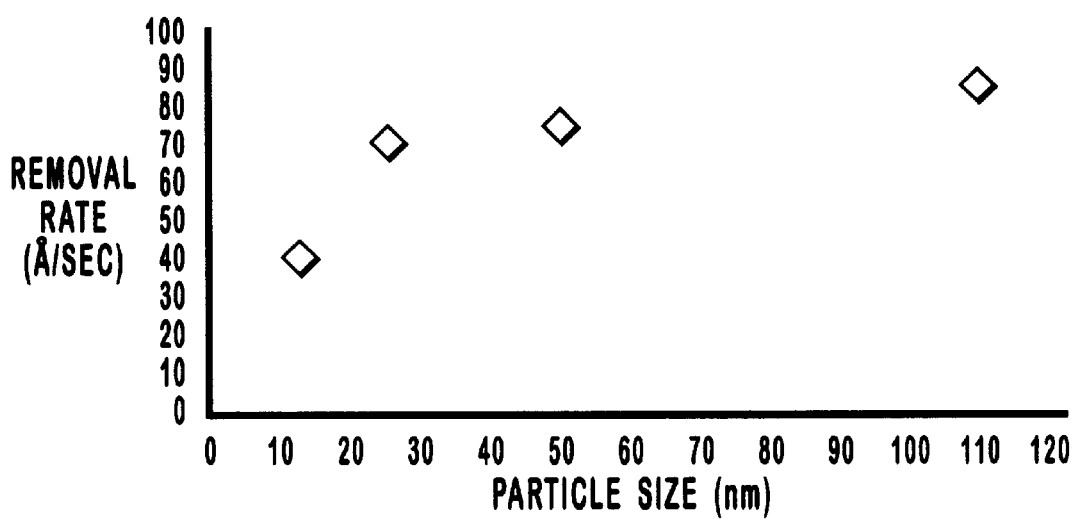
FIG. 5 is a graph plotting the removal rates of a material from a planar surface for varying diameters of indenter particles used in a polishing slurry.

FIG. 5 illustrates the differing rates of removal of material from a planar surface for several sizes of silica particles ($SiO_2$) in use as indenter particles. In FIG. 5, all parameters are held constant other than the indenter particle size. For the given parameters, a slurry of approximately 12 nm mean diameter indenter particles was found to reduce the height of a planar surface of an oxide layer on a semiconductor structure at a rate of about 40 angstroms per second. A slurry of approximately 25 nm mean diameter indenter particles reduced the height of a planar surface at a rate of about 70 angstroms per second. A slurry of approximately 50 nm mean diameter indenter particles reduced the height of a planar surface at a rate of about 75 angstroms per second. A slurry of approximately 120 nm mean diameter indenter particles reduced the height of a planar surface of oxide at a rate of about 85 angstroms per second.

From this data, it can be seen that the height reduction rate for planar surfaces drops off slightly between the 120 and 50 nm indenter particle sizes and again between the 50 nm and 25 nm indenter particle sizes, and then drops off significantly when size of the indenter particles is reduced below 25 nm in mean diameter. A comparatively low planar surface height reduction rate occurs at around the 12 nm mean diameter size and below.

Figure 6:
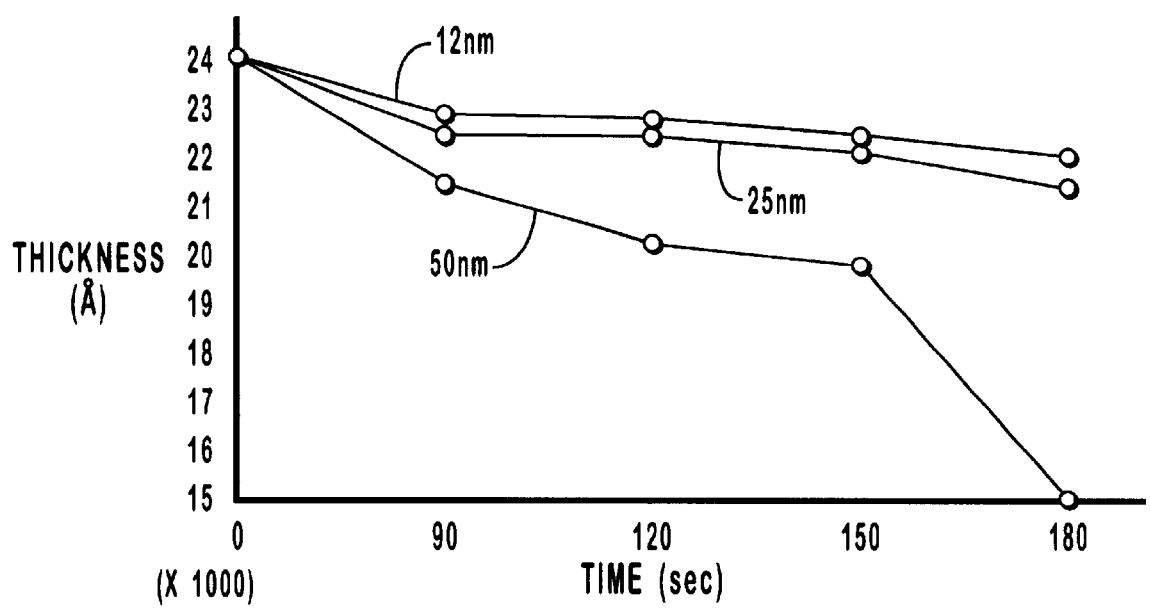
FIG. 6 is a graph plotting the depth of a planar dielectric layer on a semiconductor structure over time with various diameters of indenter particles in a process.

FIG. 6 shows similar data presented in the form of the thickness over time of a layer of material on a semiconductor structure polished with indenter particles of mean diameters of 12 nm, 25 nm, and 50 nm. All other parameters are held constant. The thickness of the layer of material for locations which are planar corresponds to planar surface height, which as referred to herein, is the thickness of a layer of material on a semiconductor substrate surface that has been planarized to substantial smoothness and to a consistent depth.

In FIG. 6, as in FIG. 5, the lowest reduction rate over time of the thickness of a planar surface of the layer of material occurs at the 12 nm diameter indenter particle size, and for the 25 nm diameter indenter particle size, the amount is just slightly higher. For the 50 nm diameter indenter particle size, the amount is much higher. While not shown in FIG. 6, for the 120 nm diameter indenter particle size, currently a standard size for conventional abrasive polishing processes, the amount of planar surface material removed over time is greater than for the 50 nm diameter indenter particle size.

Figure 7:
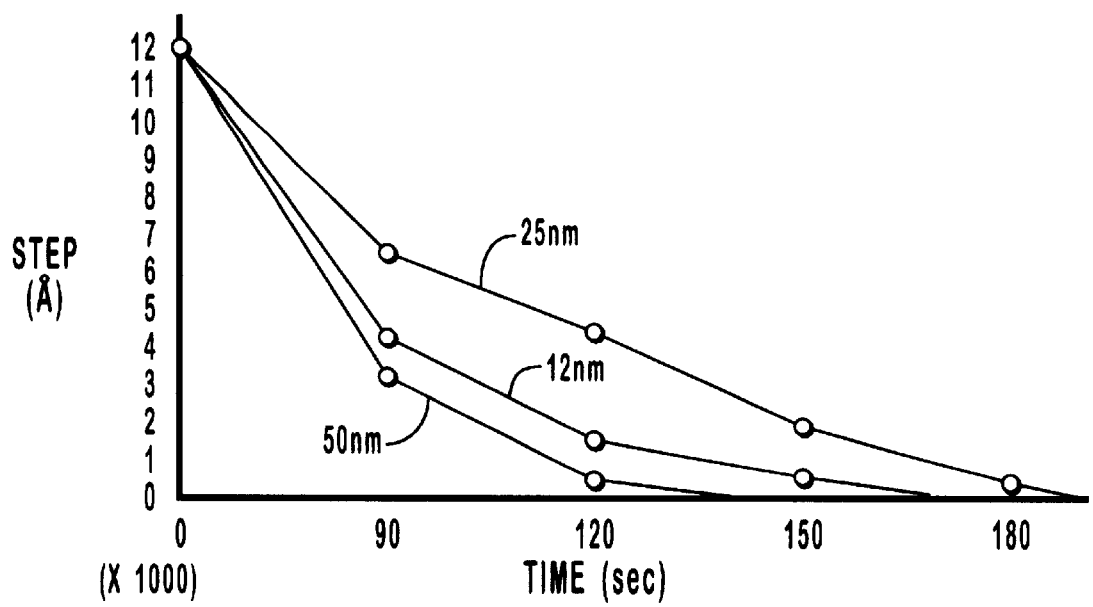
FIG. 7 is a graph plotting the step height of vertically protruding features of a non-planar surface of a semiconductor structure over time with various diameters of indenter particles used in an abrasive polishing process.

FIG. 7 shows the relative step heights of vertically protruding features protruding from a non-planar surface being polished with indenter particles of diameters of 12 nm, 25 nm, and 50 nm over time during a process of chemical-mechanical polishing with all other parameters held constant. Step height, as referred to herein, is the height of vertically protruding features 20a of FIG. 1 above the lowest point in the non-planar surface, shown in FIG. 1 as troughs 20b. For the 12 nm diameter indenter particle size, the amount of non-planar surface material removed is surprisingly higher than for the 25 nm diameter indenter particle size. FIG. 7 illustrates that, at certain smaller indenter particle sizes, the non-planar surface height reduction rate remains fairly constant. Larger particles tend to abrade raised surfaces, such as vertically protruding features 20a of FIG. 1, resulting in a high material removal rate. Smaller indenter particles of properly selected size, on the other hand, have a reduced momentum at a given speed that causes the indenter particles to impact at or near the tops of upper surfaces such as vertically protruding features 20a, rather than impacting surfaces of lesser height such as trenches 20b between vertically protruding features 20a. This causes the material removal rate from the upper surfaces, for properly selected smaller particles, to be close to that of the larger indenter particles, while allowing for a reduced material removal rate from the surfaces of lesser height. Smaller indenter particles also tend to cause fewer surface defects such as scratches and abrasions in semiconductor structure surfaces.

Figure 8:
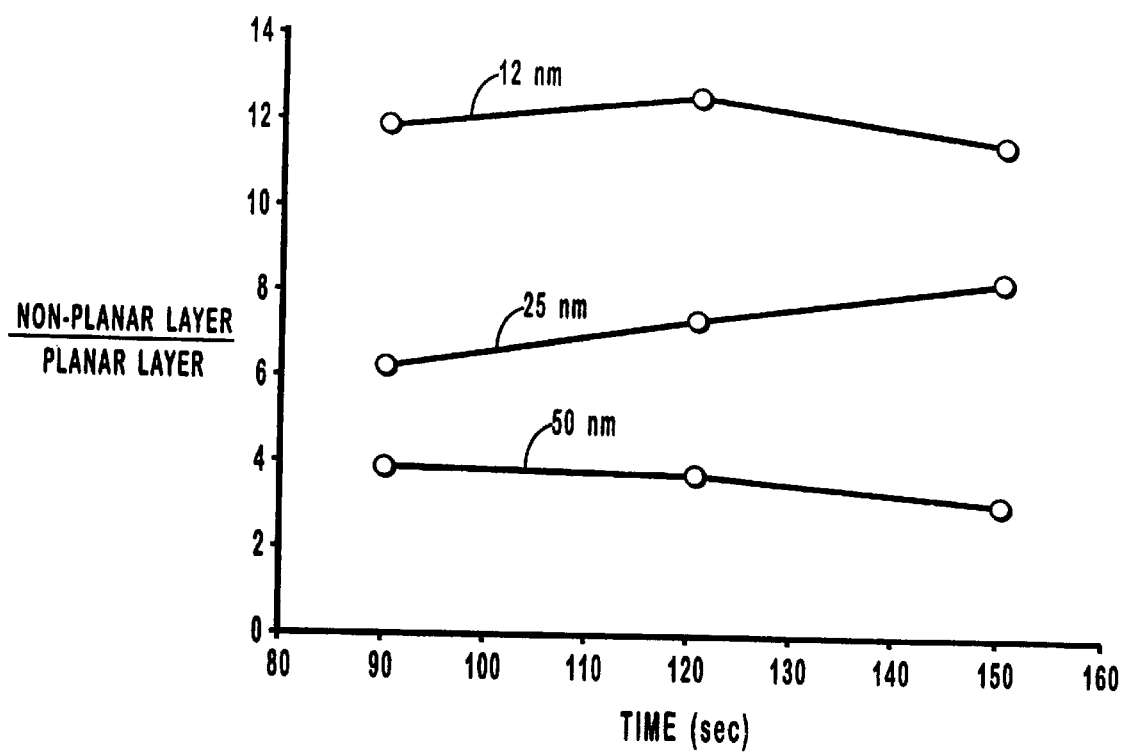
FIG. 8 is a graph plotting the difference in removal rates over time between a non-planar surface and a planar surface with various diameters of indenter particles used in an abrasive polishing process.

FIG. 8 illustrates the differences in material removal rates of non-planar surfaces relative to planar surfaces for indenter particles of mean diameters of 12, 25, and 50 nm. As shown in FIG. 8, a particle size of 12 nm in mean diameter has a material removal rate over a time period of between approximately 90 and 150 seconds during the planarization process that is reduced by a factor of 12 once the surface has become substantially planar. Slurries containing particles having a mean diameter of about 25 nm have a corresponding relative removal ratio of between a factor of about 6 and a factor of about 9. Slurries having mean indenter particle size of about 50 nm in diameter have a relative removal rate ranging from between a factor of about 4 and a factor of about 3 over the time period of 90–150 seconds. For slurries containing particles greater than 50 nm, the relative rate is even lower. For example, for particles of a mean diameter of about 120 nm, the rate is generally less than a 8 factor of about 2.

FIG. 8 illustrates relative height reduction rates over time. The average of these height reduction rates for a given period of time would result in an overall height reduction rate for that period of time. Accordingly, when used herein, the term "overall height reduction rate" is intended to mean the total amount of height reduced from the semiconductor substrate surface for the time period specified, for example. The period of time may be while the surface is planar, non-planar, or both, depending on how the period of time is specified.

From the data of FIGS. 5 through 8, it can be seen that, for an abrasive polishing planarization process with process parameters maximized for high material removal rates and a polishing slurry provided with indenter particle sizes selected to be generally lower than 50 nm in mean diameter, high non-planar surface height reduction rates can be maintained, while dramatically lowering planar surface height reduction rates. This results in the selectivity to planar surfaces that provides the previously discussed advantages.

In accordance with the above-presented data, the selection of indenter particles of a size of about 50 nm or less in mean diameter is a preferred manner of achieving a selectivity to planar surfaces. Even more preferred is the selection of an indenter particle size in a range from about 8 to about 25 nm mean diameter. Currently, the most preferred manner of achieving a selectivity to planar surfaces is the selection of indenter particles having a mean diameter of about 12 nm, due to the characteristic of 12 nm mean diameter indenter particles of providing a planar surface height reduction rate that is about one twelfth the non-planar surface height reduction.

It has been found that indenter particles of a size much under 12 nm mean diameter in a polishing slurry are subject to electrostatic forces which cause coagulation and flocculation of the indenter particles, causing the indenter particles to form much larger combined indenter particles and to assume the removal rate characteristics of the larger indenter particle size. The electrostatic forces can be alleviated by changing pH levels, but doing so upsets the chemical balance of the chemical reactants in the polishing slurry. Accordingly, under the improved planarization process of the present invention, a mean and relatively constant diameter of about 12 nm has been selected as the most preferred indenter particle size.

The data of FIGS. 5 through 8, which was taken holding all parameters other than particle size constant, illustrate one manner of selecting the parameters of the planarization process to achieve a high selectivity to planar surfaces. Accordingly, one embodiment of the present invention comprises the selection of indenter particles in the polishing slurry that have a mean particle size which causes the planarization process to reduce the height of surface on the semiconductor structure at a substantially higher rate when the surface is non-planar, than when the planar surface has been planarized. Preferred particle sizes are as stated above.

The improved planarization process has been found to work well for planarizing insulating substrates such as oxide, but it is anticipated that other substrates such as W, polysilicon, Al, Cu, $Si_3N_4$, and mirror steels can also be planarized with the improved planarization process with like or similar results. Except as herein discussed, the improved planarization process is intended to be conducted under conventional parameters as are commonly known in the art.

Figure 10:
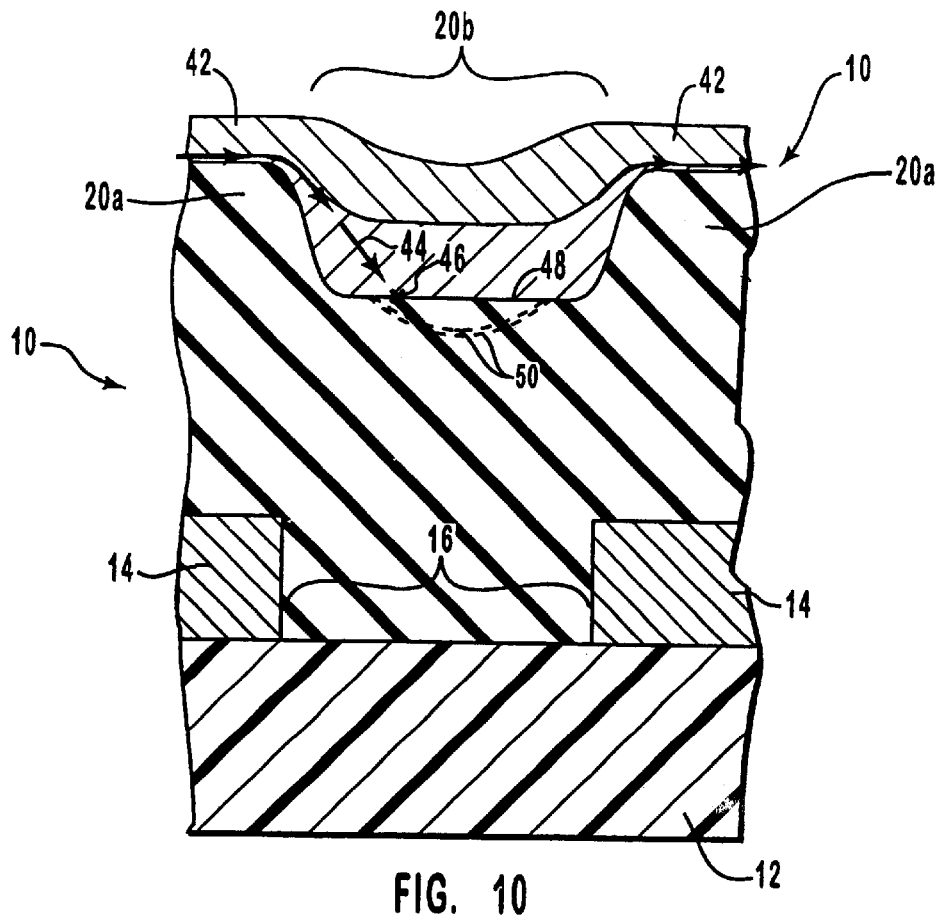
FIG. 10 shows a partial cross-sectional view of a semiconductor structure that is undergoing an abrasive polishing process of the present invention with a non-conformal polishing pad.

Due to the selectivity of the improved planarization process to planar surfaces, abrading or polishing effectively stops once a planar surface is achieved. The improved planarization process also does not abrade limited flat, open regions, such as the bottoms of troughs 20b of FIG. 1. The improved planarization process consequently substantially eliminates localized over-polishing. As a result, interlevel dielectric layer 18 of FIG. 1 does not have to be over-deposited and can be deposited essentially with the depth wherein troughs 20b in interlevel dielectric layer 18 are at a target height above the tops of arrays 14 at some target thickness above the feature. Such an arrangement is shown in FIG. 10, wherein the target height is substantially at the level of the tops of arrays 14. It has been found that a slight over-deposit is still necessary when using indenter particle of around 25 nm in mean diameter, but not when using indenter particle sizes of around 12 nm in mean diameter. A preferred slight over-deposit is in a range from about 1 to about 100 percent greater than height S (the height needed to fill slots 16 as in FIG. 1), more preferably from 2 to about 50 percent greater than height S, and most preferably from about 3 to about 10 percent greater than height S.

The selectivity exhibited by the improved planarization process planarizes surfaces more quickly and more accurately than prior art planarization processes described above, thus increasing throughput and yield. The improved planarization process also reduces the creation of domes, or doming, on the die after planarization.

A further consideration of the improved planarization process of the present invention is the selection of the polishing surface. Best results are achieved with the use of a non-conformal polishing surface. A pad-stack with a substantially non-conformal polishing pad such as the IC-1000 perforated pad and a FR4 underpad manufactured by Rodel Corporation of Phoenix Ariz. is preferred when using a rotational polishing system When using a linear track polishing system, a platen with a correspondingly low conformality is similarly preferred. As such, the polishing surface will preferably not substantially conform to non-planar surfaces on a semiconductor substrate of a semiconductor structure when the semiconductor structure is placed in contact with the polishing surface at a selected polishing pressure from about 3 to about 9 PSI as the semiconductor structure is being polished by the polishing surface.

Figure 9:
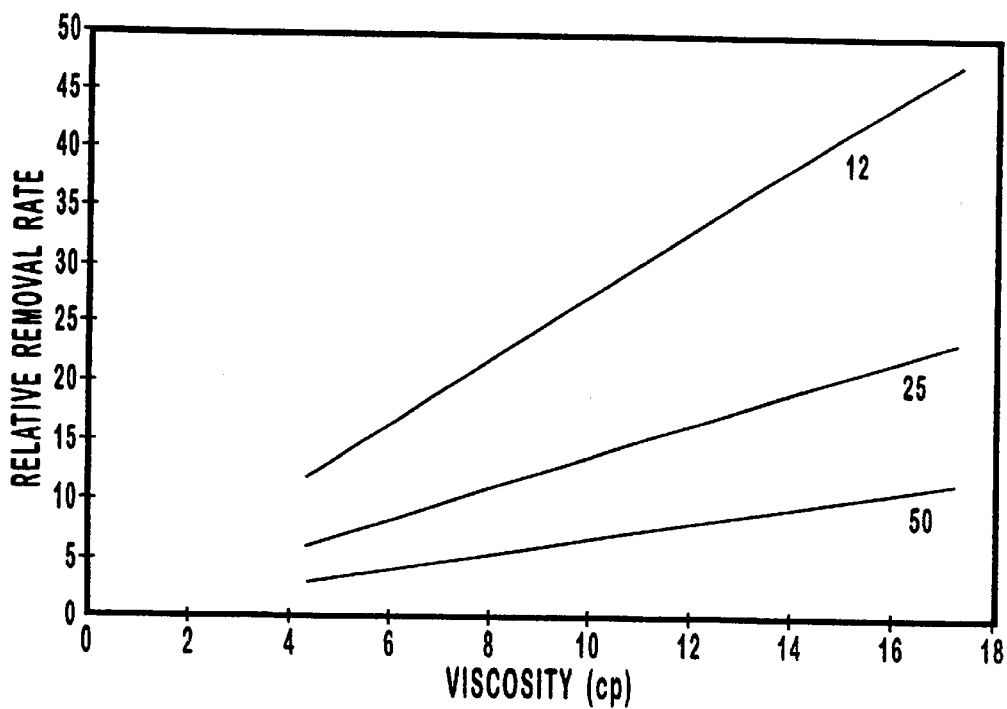
FIG. 9 shows a partial cross-sectional view of a semiconductor structure that is undergoing an abrasive polishing process with a conformal polishing pad.

FIG. 9 illustrates the problems associated with the selection of a conformal polishing pad. Therein, a conformal polishing pad 42 such as the Suba IV pad manufactured by Rodel Corporation of Phoenix Ariz. is shown polishing an interlevel dielectric layer 18 on a semiconductor substrate 12 comprising, in the depicted embodiment, a silicon substrate of semiconductor structure 10. A polishing slurry 38 is being used that contains indenter particles of a particle size of about 50 nm in mean diameter or less, and other parameters as given above. FIG. 9 shows that conformal polishing pad 42 flexes, causing it to protrude into a trough 20b between a pair of vertically protruding features 20a. This flexure, in addition to viscous drag forces on the smaller indenter particles with less momentum, gives the indenter particles in polishing slurry 38 a downward trajectory 44.

Figure 4:
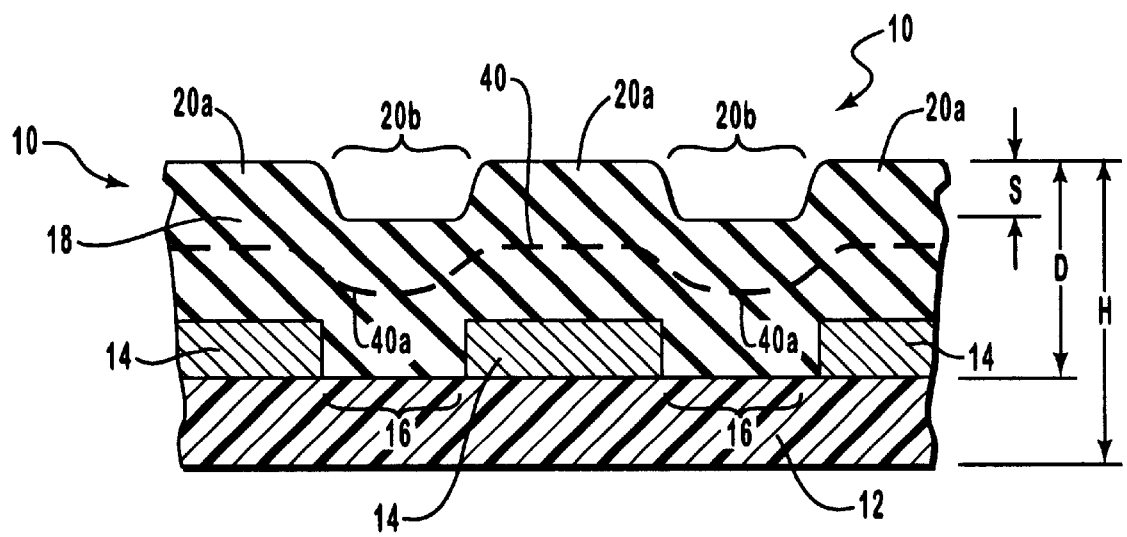
FIG. 4 shows a cross-sectional view of the semiconductor structure of FIG. 1, and illustrates the occurrence of localized over-polishing at an intermediate stage in an abrasive polishing process.

Downward trajectory 44 causes the indenter particles to impact at a location 46 on a trough bottom 48 of trough 20b in interlevel dielectric layer 18. The impact of the indenter particles of polishing slurry 38 causes a localized over-polishing 50 to occur at a trough bottom 48, similar to that of intermediate non-planar surface 40 of FIG. 4 described above.

In FIG. 10, a pad-stack with a non-conformal polishing pad 52, such as the IC perforated pad with the FR4 underpad, is being used that has little flexure and protrudes only slightly into trough 20b. Again, a polishing slurry with indenter particles of a mean diameter of about 50 nm or less is being used. Non-conformal polishing pad 52 enables the small indenter particles of polishing slurry 38 to have a trajectory 54 that causes an impact 56 on a sidewall 58 of trough 20b, thereby helping to reduce the height of vertically protruding features 20a and to avoid localized over-polishing of trough bottom 48. Thus, a polishing slurry with 50 nm mean diameter or less indenter particles together with a non-conforming polishing surface such as non-conformal polishing pad 52 will remove relatively little material from trough bottom 48 at the more parallel angle of trajectory 54 caused by the non-conformal polishing surface.

After discovering that an optimum selectivity to planar surfaces over non-planar surfaces occurred with a particle size of about 12 nm, a dimensional analysis was undertaken to understand the relationship of particle size during polishing to other parameters. The dimensional analysis was begun under the assumption that the particles behaved in slurry within the Stoke's Law regime. The derivation of Stoke's Law can be found in any momentum transfer text such as Transport Phenomena, by Bird, Stewart, and Lightfoot (John Wiley and Sons, New York, 1960) pp. 56–60. Using Stoke's law, a relationship of particle position as a function of time, y(t) was derived:

$$y(t)=(2/9)(\rho R^2/\mu)V(1-exp-(\mu/[(2/9)(\rho R2/\mu)])t) \qquad (1)$$

where V is the particle initial velocity, $\rho$ is particle density, R is particle diameter, t is the time, and i is viscosity of the liquid in the slurry. It can be appreciated that within the polishing times used during conventional planarization (see FIGS. 6–8), the exponential term goes virtually to zero and a relationship emerges, for a given particle, between particle density and slurry viscosity.

Figure 11:
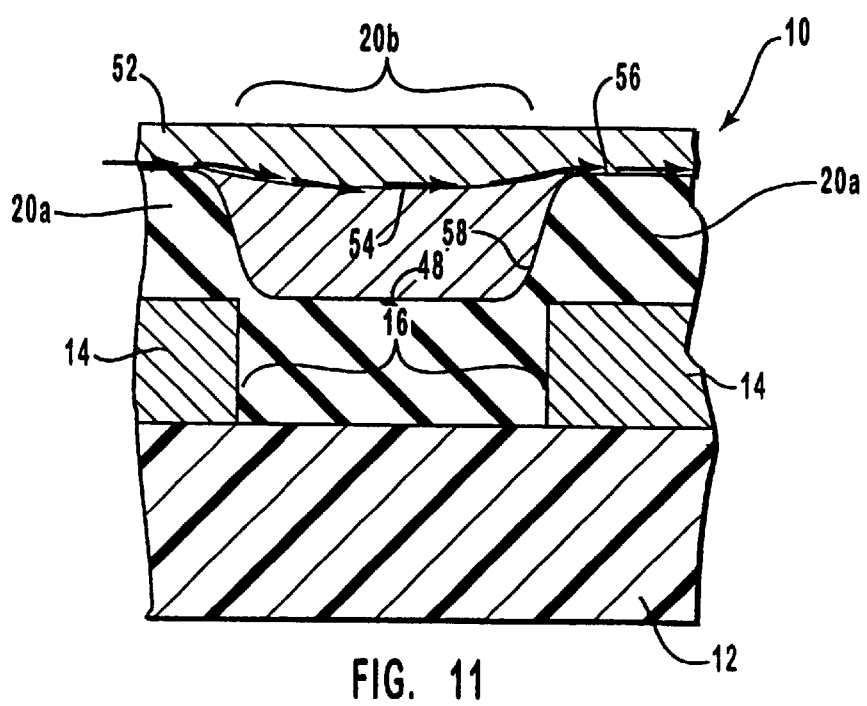
FIG. 11 is a graph illustrating the relationship discovered between particle size and viscosity as they create a synergistic effect of polishing selectivity that favors planar surfaces over nonplanar surfaces.

Planarization selectivity was then studied for particle sizes previously tested within size ranges as set forth above. As a starting point, the optimum 12 nm particle previously discovered was selected and with the viscosity of the preferred polishing solution used therewith, planarization selectivity was studied by varying particle size and viscosity around this starting point. FIG. 11 illustrates what was discovered about the particles used in the present invention. It can be seen that generally as viscosity increases, the planarization selectivity likewise increases. It can also be seen that the perceived optimum planarization selectivity of about 12 for the 12 nm particle size could also be obtained for the 25 nm particle at a viscosity of about 9 centipoise. It can likewise be seen that the perceived optimum planarization selectivity of about 12 for the 12 nm particle size could also be obtained for the 50 nm particle at a viscosity of about 18 centipoise.

It can now be appreciated that various particle sizes within or near the range of 12 to 50 nm will behave similarly by considering the relationship between particle size and viscosity as illustrated in FIG. 11. By applying the inventive method to compositions used in the microelectronics field, it can be appreciated that current planarization equipment will be limited by the viscosity that may be selected. For example, a typical CMP apparatus will not be able to sustain a polishing motion with a viscosity above about 40 centipoise. Thus a viscosity range is preferred from about 1 centipoise to about 40 centipoise, preferably from about 4 centipoise to about 20 centipoise, and most preferably from about 4 centipoise to about 14 centipoise.

Further analysis of FIG. 11 provides a quick means of choosing a particle size for a desired selectivity and a given viscosity. Alternatively, a viscosity may be chosen for a desired selectivity and a given particle size. It can be immediately observed that the distance from the baseline of the axis measuring selectivity to any point for a given viscosity is approximately double as an inverse proportionality to the particle size. In other words, process engineer may select a particle size and by graphical extrapolation or interpolation, find a corresponding approximate viscosity for a preferred selectivity.

Because a particle size below about 8 nm substantially limits the removal rate to about zero, it is a preferred method of the present invention to select a particle size first to assure a high throughput removal rate, and then use the information contained in FIG. 11 or elsewhere in the specification to prepare a specific slurry viscosity in order to choose a preferred selectivity. Thus, the present invention relates also to a method of maximizing throughput while maximizing yield.

The method maximizing throughput of a polishing process while maximizing yield may comprise providing a surface to be polished such as a semiconductor structure. The method includes providing abrasive particles of a selected mean size range and choosing a polishing selectivity ratio in favor of planar surfaces over non-planar surfaces for the specific application. The method includes determining a polishing solution viscosity that will achieve the selected polishing selectivity with the provided abrasive particles and includes providing a polishing solution that corresponds to the determined polishing solution viscosity and the abrasive particles of the selected size. A polishing slurry is then formed from the selected abrasive particles and the selected polishing solution, and then polishing the surface is carried out.

The method maximizing throughput of a polishing process while maximizing yield for a semiconductor structure can be carried out on a dielectric material such as BPSG, TEOS, and the like. The method maximizing throughput of a polishing process while maximizing yield with have an abrasive particle selected mean size range from about 8 nm to about 10,000 nm, preferably from about 9 nm to about 1,000 nm, more preferably from about 10 nm to about 100 nm, and most preferably about 12 nm.

The method maximizing throughput of a polishing process while maximizing yield includes choosing a polishing selectivity ratio in a range from 2 to about 1,000, more preferably from about 4 to about 50, and most preferably from about 8 to about 20. It can be appreciated that the lesser the excess dielectric that is deposited above the step height corresponding to height S in FIG. 1, the higher the selectivity is desired.

The method maximizing throughput of a polishing process while maximizing yield includes choosing polishing solution that corresponds to the determined polishing solution that will have a viscosity for polishing materials for semiconductor structures in a viscosity range from about 1 to about 50 centipoise, preferably from about 2 to about 20 centipoise, and most preferably from about 4 to about 16 centipoise.

The method includes either selecting a particle size or a polishing solution viscosity, is then selecting a polishing selectivity specific to the application. Finding an approximate polishing solution viscosity, if for example the particle size were selected first, may be carried out by linear interpolation or extrapolation of data from Table 1. Table 1 provides data for a BPSG surface to be polished with a silica abrasive. Table 1 illustrates a method of choosing a polishing selectivity as a function of particle size, R, and viscosity, $\mu$.

TABLE 1

| | Selectivity | | | | | | |
| --- | --- | --- | --- | --- | --- | --- | --- |
| | $\mu$, Centipoise | | | | | | |
| R, nm | 6 | 8 | 10 | 12 | 14 | 16 | 18 |
| 12 | 16.8 | 22.4 | 28.0 | 33.6 | 39.2 | 44.8 | 50.4 |
| 25 | 8.4 | 11.2 | 14.0 | 16.8 | 19.6 | 22.4 | 25.2 |
| 50 | 4.2 | 5.6 | 7.0 | 8.4 | 9.8 | 11.2 | 12.6 |

After an article to be planarized has achieved a desired planarity according to the inventive method, further polishing may be required to remove more of the polishing layer. For such an operation, the slurry including particle size may be changed to optimize throughput. Because the present invention is directed to achieving a planar surface-selective planarization, conventional planarization techniques may be carried out at this point of the process.

It has been found that special attention must be paid to the cleaning of a semiconductor substrate after planarization when using the smaller indenter particle sizes because smaller indenter particles form a greater surface area for chemical reactions during the cleaning. Moreover, the cleaning process should be sufficient to prevent a coagulation of the indenter particles which create larger resultant particles.

A polishing slurry is created by the improved planarization process. Each indenter particle in the polishing slurry will preferably be substantially composed of alumina, ceria, tantalum oxide, or silica. Most preferably, each indenter particle will be substantially composed of silica. The polishing slurry is composed of indenter particles selected as described above to be highly selective to planar surfaces, so that the polishing process planarizes rapidly and stops when a planar surface is achieved.

The polishing slurry of the present invention can be incorporated into a system including an abrasive polishing machine, a non-conformal polishing pad, and a semiconductor.

The selectivity to planar surfaces of the present inventive process creates several advantages over the prior art described above. These advantages include more efficient planarization of a semiconductor structure and a larger window of time to stop the planarization process once the semiconductor substrate surface on the semiconductor structure is planarized without unnecessarily reducing the height of the semiconductor substrate. Also, localized over-polishing of flat, open regions is substantially eliminated, with the result that less interlevel dielectric material is required to be deposited. Less furnace time and a correspondingly lower thermal budget are required to density interlevel dielectric material that can be made substantially thinner. The formation of domes on the semiconductor structure after planarization is reduced, throughput is increased due to the faster planarization, and the semiconductor structure is not, as a result, as destructively scratched. The smaller indenter particle size also causes fewer surface defects than a larger particle size.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A planarizing process using a polishing machine that operates by moving a polishing surface against a non-planar surface of a structure in a polishing slurry including a plurality of abrasive particles, the process comprising:

operating said polishing machine to remove material from the surface of the structure at a first material removal rate of X, wherein said plurality of abrasive particles have a mean diameter in a range from about 8 nm to about 50 nm; and ceasing operation of said polishing machine when a second material removal rate from the surface of the structure is not greater than X/4 and the surface of the structure is planar.

2. The process of planarizing as defined in claim 1, wherein the mean diameter is in a range from about 8 nm to about 25 nm.

3. The process of planarizing as defined in claim 1, wherein the mean diameter is about 8 nm.

4. The process of planarizing as defined in claim 1, wherein operating said polishing machine to remove material from the surface of the structure is conducted at a constant speed and at a constant pressure of said polishing surface against said non-planar surface of said structure in said polishing slurry.

5. A process of planarizing comprising:
providing a polishing surface;
providing a polishing slurry comprised of a plurality of abrasive particles, the plurality of abrasive particles having a mean diameter in a range from about 8 nm to about 25 nm;
providing a structure having a surface,
moving the polishing surface against the surface of the structure in the polishing slurry, wherein there is a first material removal rate of material from the surface of the structure equal to X, and wherein the surface of the structure is non-planar; and
continuing to move the polishing surface against the surface of the structure in the polishing slurry until there is a second material removal rate of material from the surface of the structure not greater than X/4 and said surface of the structure is planarized.

6. The process of planarizing as defined in claim 5, wherein:
moving the polishing surface against the surface of the structure in the polishing slurry is conducted at a constant speed and at a constant pressure; and
continuing to move the polishing surface against the surface of the structure in the polishing slurry is conducted at the constant speed and at the constant pressure.

7. A planarizing process comprising:
selecting a material removal rate ratio from data in a table, said data in said table containing a respective material removal rate ratio for each of a plurality of viscosities of a polishing slurry for a given mean size of a plurality of abrasive particles in said polishing slurry, wherein said material removal rate ratio is derived by using a polishing machine that operates by moving a polishing surface against a surface of a test structure in said polishing slurry having said viscosity and including said plurality of abrasive particles, and wherein said material removal rate ratio is equal to:
the material removal rate of material from said surface of said test structure when said surface is non-planar;
divided by the material removal rate of material from said surface of said test structure when said surface is planar, wherein said ratio is for a given mean size of said plurality of abrasive particles in said polishing slurry having a mean diameter in a range from about 8 nm to about 25 nm; and
planarizing a surface of a production structure by operating said polishing machine using the selected viscosity and the selected mean size of said plurality of abrasive particles of said polishing slurry to remove material from said surface of said production structure that is similar to said surface of said test structure.

8. The planarizing process as defined in claim 7, wherein:
planarizing a surface of a production structure by operating said polishing machine is conducted at a constant speed and at a constant pressure; and
said polishing machine that operates by moving said polishing surface against said surface of said test structure is operated at said constant speed and at said constant pressure.

9. A polishing process of using a polishing machine that operates by moving a polishing surface against a non-planar surface of a semiconductor structure to planarize the same in a polishing slurry including a plurality of abrasive particles, the process comprising:
removing material from the non-planar surface of the semiconductor structure using the polishing machine, wherein said plurality of abrasive particles have a mean diameter in a range from about 8 nm to about 50 nm, and the rate of material removal from the surface of the semiconductor structure is equal to X, wherein said semiconductor structure surface is composed of a material selected from a group consisting of a dielectric, silicon dioxide, tungsten, polysilicon, aluminum, copper, and $Si_3N_4$; and
halting said material removal when said rate of material removal is not greater than X/4 and the surface of the structure is planar.

10. The process of planarizing as defined in claim 9, wherein:
removing material from the non-planar surface of the semiconductor structure using the polishing machine by moving said polishing surface against said non-planar surface of said semiconductor structure to planarize the same in said polishing slurry is conducted at a constant speed and at a constant pressure.

11. A polishing process as recited in claim 9, wherein the abrasive particles are composed of at least one material selected from the group consisting of ceria, alumina, $Ta_2O_5$, silica, titania, zirconia, manganese oxide, and mixtures thereof.

12. A process as recited in claim 9, wherein said material removal is halted when said rate of material removal is not greater than X/5 and the surface of the semiconductor structure is planar.

13. A process as recited in claim 9, wherein said material removal is halted when said rate of material removal is not greater than X/6 and the surface of the semiconductor structure is planar.

14. A process as recited in claim 9, wherein said material removal is halted when said rate of material removal is not greater than X/10 and the surface of the semiconductor structure is planar.

15. A polishing process according to claim 9, wherein said surface of the semiconductor structure is a dielectric.

16. A polishing process according to claim 9, wherein said rate of material removal from the surface of the semiconductor structure when planar is minimized by increasing the polishing solution viscosity.

17. A polishing process according to claim 9, wherein said mean diameter is in a range from about 8 nm to about 25 nm.

18. A process of planarizing comprising:
providing a polishing surface;
providing a polishing slurry comprised of a plurality of abrasive particles, the plurality of abrasive particles having a mean diameter in a range from about 8 nm to about 50 nm;
providing a semiconductor structure having a surface composed of a material selected from a group consisting of a dielectric, silicon dioxide, tungsten, polysilicon, aluminum, copper, and $Si_3N_4$;
moving the polishing surface against the surface of the semiconductor structure in the polishing slurry, wherein there is a first material removal rate of material from the surface of the semiconductor structure equal to X, and wherein the surface of the semiconductor structure is non-planar; and continuing to move the polishing surface against the surface of the semiconductor structure in the polishing slurry until there is a second material removal rate of material from the surface of the semiconductor structure not greater than X/4 and said surface of the semiconductor structure is planarized.

19. A process as recited in claim 18, wherein substantially each abrasive particle is substantially composed of at least one material selected from the group consisting of ceria, alumina, $Ta_2O_5$, silica, titania, zirconia, manganese oxide, and mixtures thereof.

20. A process as recited in claim 18, wherein the plurality of abrasive particles have a mean diameter in a range from about 8 nm to about 25 nm.

21. A process as recited in claim 18, wherein the second material removal rate is less than X/5.

22. A process as recited in claim 18, wherein the second material removal rate is less than X/6.

23. A process as recited in claim 18, wherein the second material removal rate is less than X/10.

24. A process as recited in claim 18, wherein the surface of the semiconductor structure comprises a portion of a top surface of said semiconductor structure.

25. A process as recited in claim 18, wherein the surface of the semiconductor structure comprises substantially an entire top surface of said semiconductor structure.

26. The process of planarizing as defined in claim 18, wherein:

moving the polishing surface against the surface of the semiconductor structure in the polishing slurry is conducted at a constant speed and at a constant pressure; and continuing to move the polishing surface against the surface of the semiconductor structure in the polishing slurry is conducted at the constant speed and at the constant pressure.

27. The process of planarizing as defined in claim 19, wherein:

moving the polishing surface against the surface of the semiconductor structure in the polishing slurry is conducted at a constant speed and at a constant pressure; and continuing to move the polishing surface against the surface of the semiconductor structure in the polishing slurry is conducted at the constant speed and at the constant pressure.

28. A planarizing process using a polishing machine that operates by moving a polishing surface against a non-planar surface of a semiconductor structure in a polishing slurry including a plurality of abrasive particles, the process comprising:

operating said polishing machine to remove material from the surface of the semiconductor structure at a first material removal rate of X, wherein said plurality of abrasive particles have a mean diameter in a range from about 8 nm to about 50 nm, wherein said semiconductor structure surface is composed of a material selected from a group consisting of a dielectric, silicon dioxide, tungsten, polysilicon, aluminum, copper, and $Si_3N_4$; and ceasing operation of said polishing machine when a second material removal rate from the surface of the semiconductor structure is not greater than X/4 and the surface of the semiconductor structure is planar.

29. A process as recited in claim 28, wherein the second material removal rate is less than X/6.

30. A process as recited in claim 28, wherein the second material removal rate is less than X/10.

31. A process as recited in claim 28, wherein the surface of the semiconductor structure comprises a portion of a top surface of said semiconductor structure.

32. A polishing process according to claim 28, wherein said surface of the semiconductor structure is a dielectric.

33. A polishing process according to claim 28, wherein said rate of material removal from the surface of the semiconductor substrate when planar is minimized by increasing the polishing solution viscosity.

34. A polishing process according to claim 28, wherein said mean diameter is in a range from about 8 nm to about 25 nm.

35. A polishing process according to claim 28, wherein said surface of the semiconductor structure includes a silicate and said abrasive particles includes silica.

36. The process of planarizing as defined in claim 28, wherein:

operating said polishing machine to remove material from the surface of the semiconductor structure by moving said polishing surface against said non-planar surface of said semiconductor structure in said polishing slurry is conducted at a constant speed and at a constant pressure.

37. A process of planarizing comprising:

providing a polishing surface;

providing a polishing slurry comprised of a plurality of abrasive particles, the plurality of abrasive particles having a mean diameter in a range from about 8 nm to about 50 nm;

providing a semiconductor structure having a surface composed of a material selected from a group consisting of a dielectric, silicon dioxide, tungsten, polysilicon, aluminum, copper, and $Si_3N_4$;

moving the polishing surface against the surface of the semiconductor structure in the polishing slurry, wherein there is a first material removal rate of material from the surface of the semiconductor structure equal to X, and wherein the surface of the semiconductor structure is non-planar; and continuing to move the polishing surface against the surface of the semiconductor structure in the polishing slurry until there is a second material removal rate of material from the surface of the semiconductor structure not greater than X/4 and said surface of the semiconductor structure is planarized.

38. A planarizing process comprising:

selecting a material removal rate ratio from data in a table, said data in said table containing a respective material removal rate ratio for each of a plurality of viscosities of a polishing slurry for a given mean size of a plurality of abrasive particles in said polishing slurry, wherein said material removal rate ratio is derived by using a polishing machine that operates by moving a polishing surface against a surface of a test semiconductor structure in said polishing slurry having said viscosity and including said plurality of abrasive particles, and wherein said material removal rate ratio is equal to:

the material removal rate of material from said surface of said test semiconductor structure when said surface is non-planar;

divided by the material removal rate of material from said surface of said test semiconductor structure when said surface is planar, wherein said ratio is for a given mean size of said plurality of abrasive particles in said polishing slurry having a diameter in a range from about 8 nm to about 50 nm; and planarizing a surface of a production semiconductor structure by operating said polishing machine using the selected viscosity and the selected mean size of said plurality of abrasive particles of said polishing slurry to remove material from said surface of said production semiconductor structure that is similar to said surface of said test semiconductor structure, wherein said surface of said test semiconductor structure is composed of a material selected from a group consisting of a dielectric, silicon dioxide, tungsten, polysilicon, aluminum, copper, and $Si_3N_4$.

39. A polishing process according to claim 38, wherein said viscosity of said polishing solution that corresponds to said selected material removal rate ratio is in a range from about 1 to about 1,000 centipoise.

40. A polishing process according to claim 38, wherein said surface of said test semiconductor structure includes a silicate and said abrasive particles include silica.

41. The process of planarizing as defined in claim 38, wherein:

planarizing a surface of a production semiconductor structure by operating said polishing machine is conducted at a constant speed and at a constant pressure; and said polishing machine that operates by moving said polishing surface against said surface of said test structure is operated at said constant speed and at said constant pressure.

* * * * *

UNITED STATES PATENT AND TRADEMARK OFFICE
CERTIFICATE OF CORRECTION

PATENT NO.     : 6,379,225 B1
DATED          : April 30, 2002
INVENTOR(S)    : Karl M. Robinson, Guy Hudson and Scott Meikle It is certified that error appears in the above-identified patent and that said Letters Patent is hereby corrected as shown below:

Column 5,
Line 20, before "Most" change "nm" to -- nm. --

Column 9,
Line 55, before "factor" delete "8"

Column 11,
Line 21, after "system" insert a period

Column 12,
Line 16, before "is viscosity" change "i" to -- μ --

Column 13,
Line 24, after "yield" change "with" to -- will --
Line 46, before "then" delete "is"

Column 14,
Line 37, after "required to" change "density" to -- densify --

Signed and Sealed this

Thirty-first Day of December, 2002

JAMES E. ROGAN
*Director of the United States Patent and Trademark Office*